United States Patent
Itatani et al.

(10) Patent No.: US 6,548,404 B2
(45) Date of Patent: Apr. 15, 2003

(54) METHOD AND APPARATUS FOR MANUFACTURING SEMICONDUCTOR DEVICES

(75) Inventors: Hideharu Itatani, Tokyo (JP); Masayuki Tsuneda, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 09/819,653

(22) Filed: Mar. 29, 2001

(65) Prior Publication Data

US 2001/0026963 A1 Oct. 4, 2001

(30) Foreign Application Priority Data

Mar. 31, 2000 (JP) .................................. 2000-099754
Jan. 31, 2001 (JP) .................................. 2001-024360

(51) Int. Cl.$^7$ .............................................. H01L 21/44
(52) U.S. Cl. ..................... 438/686; 438/680; 438/681
(58) Field of Search ........................... 438/680, 681, 438/686, 642, 650

(56) References Cited

U.S. PATENT DOCUMENTS 6,180,164 B1 * 1/2001 Ellis et al. .................... 427/101
6,380,080 B2 * 4/2002 Visokay ....................... 438/681

FOREIGN PATENT DOCUMENTS

JP 7-94680 4/1995
JP 07-094680 * 7/1995 .......... H01L/27/04
JP 10-163131 6/1998

* cited by examiner

Primary Examiner—Alexander Ghyka
(74) Attorney, Agent, or Firm—McGinn & Gibb, PLLC

(57) ABSTRACT

A semiconductor manufacturing method and apparatus having an excellent step coverage and capable of manufacturing semiconductor devices at low cost. The apparatus includes a reaction chamber 4 adapted to accommodate a substrate 1, a gas feed port through which a raw material gas is supplied to the reaction chamber for forming ruthenium films or ruthenium oxide films on the substrate, and a gas exhaust port through which the raw material gas is exhausted from the reaction chamber. The raw material gas is directed from the gas feed port toward the substrate to initially form thereon a first ruthenium film or a first ruthenium oxide film by means of a thermal CVD method under first film-forming conditions, and subsequently to form a second ruthenium film or a second ruthenium oxide film on an underlayer of the first ruthenium film or the first ruthenium oxide film by means of the thermal CVD method under second film-forming conditions different from the first film-forming conditions, the second ruthenium film or the second ruthenium oxide film having a thickness greater than that of the first ruthenium film or the first ruthenium oxide film.

20 Claims, 4 Drawing Sheets

METHOD AND APPARATUS FOR MANUFACTURING SEMICONDUCTOR DEVICES

BACKGROUND OF THE INVENTION

1. Field of the Invention

The present invention relates to a method and apparatus for manufacturing semiconductor devices in which ruthenium films or ruthenium oxide films are formed on a substrate.

2. Description of the Prior Art

The formation of thin ruthenium films, major candidates of next generation's DRAM electrodes, using a sputtering process, has been technically established and frequently employed at the research level. However, the formation of thin films by the use of sputtering is defective in the ability of covering stepped portions (hereinafter called "step coverage"), and hence a thermal CVD method having a superior step coverage is preferred for mass production processes and has been actively developed.

In the thermal CVD method, the film-forming raw material is generally in the form of a liquid of an organic metal, a solution with a powder of an organic metal dissolved in a solvent or the like, these materials being vaporized by means of a vaporizer or bubbling and supplied to a substrate. Here, bisethyl-cyclopentadienyl-ruthenium $(Ru(C_2H_5C_5H_4)_2)$ is referred to as such a raw material.

In general, a ruthenium film or a ruthenium oxide film is formed on an upper portion of an interlayer insulation film such as a silicon oxide film, a silicon nitride film, etc., or on an upper portion of a barrier metal layer formed of a metal such as TiN, $TiO_2$, WN, etc. However, with such an underlayer, there is a deficiency in that a delay in deposition would be caused in cases where ruthenium films or ruthenium oxide films are formed by means of a thermal CVD method while particularly using bisethyl-cyclopentadienyl-ruthenium and oxygen as raw materials. On the other hand, the step coverage in the case of using above-mentioned raw materials is good at a film-forming temperature range of about 300° C. (i.e., 290° C. to 330° C.), but at this temperature range, a delay in deposition will be caused, taking time until a thin film of a desired thickness has been formed. Thus, this is not suitable for mass production. Moreover, when the film formation is performed at a temperature higher than 330° C., the time for the film formation can be shortened, but on the contrary, there arises a deficiency in that the step coverage is impaired.

On the other hand, in the case where ruthenium films or ruthenium oxide films are formed on a substrate by means of a thermal CVD method, a deposition delay will not be caused even at a temperature as high as about 300° C. if a ruthenium film or a ruthenium oxide film is formed in advance on the substrate by the use of a sputtering apparatus. However, this results in a further disadvantage that it is necessary to use two reactors, thus reducing the throughput and increasing the cost of equipment.

SUMMARY OF THE INVENTION

Accordingly, the object of the present invention is to provide a method for manufacturing semiconductor devices at low cost, which is excellent in the step coverage and the throughput.

Thus, according to one aspect of the present invention, there is provided a semiconductor manufacturing method including a film-forming process in which ruthenium films or ruthenium oxide films are formed on a substrate by using a gas vaporized from a ruthenium liquid material and an oxygen-containing gas. The film-forming process comprises: an initial film-forming step for initially forming a first thin film of ruthenium or ruthenium oxide on the substrate under first film-forming conditions; and a main film forming step for forming a second thin film of ruthenium or ruthenium oxide on the first thin film under second film-forming conditions different from the first film-forming conditions, the second thin film having a thickness greater than that of the first thin film. With this semiconductor manufacturing method, it is possible to provide semiconductor devices which are excellent in the step coverage, high in throughput, and low in the cost of manufacture.

In a preferred form of the present invention, the initial film-forming step and the main film-forming step are performed continuously in one and the same reaction chamber by means of a thermal CVD method. Thus, semiconductor devices can be manufactured at much lower cost.

In another preferred form of the present invention, the second film-forming conditions in the main film-forming step provide a step coverage better than that of the first film-forming conditions in the initial film-forming step. Thus, semiconductor devices can be manufactured which are excellent in the step coverage, high in throughput, and low in cost.

In a further preferred form of the present invention, the second film-forming conditions in the main film-forming step provides a deposition rate greater than that of the first film-forming conditions in the initial film-forming step. Thus, semiconductor devices can also be manufactured which are excellent in the step coverage, high in throughput, and low in cost.

In a still further preferred form of the present invention, the second film-forming conditions in the main film-forming step provide a film-forming temperature or pressure higher than that of the first film-forming conditions in the initial film-forming step. Thus, in this case, too, semiconductor devices can be manufactured which are excellent in the step coverage, high in throughput, and low in cost.

In a yet further preferred form of the present invention, the second film-forming conditions in the main film-forming step provide a ratio of a flow rate of the oxygen-containing gas to a flow rate of the vaporized ruthenium gas greater than that of the first film-forming conditions in the initial film-forming step. Thus, in this case, too, semiconductor devices can be manufactured which are excellent in the step coverage, high in throughput, and low in cost.

In a further preferred form of the present invention, the first film-forming conditions in the initial film-forming step comprises a film-forming temperature in the range of from 300° C. to 350° C. and a film-forming pressure in the range of from 667 Pa to 3,999 Pa. Thus, in this case, too, semiconductor devices can be;manufactured which are excellent in the step coverage, high in throughput, and low in cost.

In a further preferred form of the present invention, the ruthenium liquid material comprises bisethyl-cyclopentadienyl-ruthenium.

According to another aspect of the present invention, there is provided a semiconductor manufacturing apparatus comprising: a reaction chamber adapted to accommodate a substrate; a gas feed port through which a raw material gas is supplied to the reaction chamber for forming ruthenium films or ruthenium oxide films on the substrate; and a gas exhaust port through which the raw material gas is exhausted from the reaction chamber; wherein the raw material gas is directed from the gas feed port toward the substrate to initially form thereon a first ruthenium film or a first ruthenium oxide film by means of a thermal CVD method under first film-forming conditions, and subsequently to form a second ruthenium film or a second ruthenium oxide film on an underlayer of the first ruthenium film or the first ruthenium oxide film by means of the thermal CVD method under second film-forming conditions different from the first film-forming conditions, the second ruthenium film or the second ruthenium oxide film having a thickness greater than that of the first ruthenium film or the first ruthenium oxide film. With such an arrangement, it is possible to provide semiconductor devices which are excellent in the step coverage, high in throughput and low in the cost of manufacture.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described in detail while referring to the accompanying drawings.

In the first place, reference will be had to the principle or inventive concept of the present invention. The method of manufacturing semiconductor devices according to the present invention includes an initial film-forming step in which a first ruthenium film or a first ruthenium oxide film is formed on a substrate by using an oxygen-containing gas and a gas which is generated through the vaporization of a ruthenium liquid material, and a main film-forming step in which a second ruthenium film or a second ruthenium oxide film is formed on the first ruthenium film or the first ruthenium oxide film which acts as an underlayer.

The ruthenium film or the ruthenium oxide film is formed under such a condition as to prevent a deposition delay from occurring in the initial film-forming step. That is, in the main film-forming step, the formation of the second ruthenium film or the second ruthenium oxide film is carried out on the first ruthenium film or the second ruthenium oxide film which has been formed in the initial film-forming step. Thus, if good step covering conditions are employed during the formation of thin films, a ruthenium film or ruthenium oxide film with a good step coverage can be formed without causing any deposition delay. For example, preferred conditions for initial film-forming (i.e., film-forming conditions for preventing a deposition delay) are as follows: the temperature is 300–350° C., optimally 315° C.; the pressure is 1333 pa–3,999 Pa (i.e., 10 Torr–30 Torr); the flow rate of a ruthenium liquid material is 0.01–0.1 ccm; the flow rate of an oxygen-containing gas is 500–3,000 sccm; and film-forming time or duration is 30–180 seconds, preferably 30–120 seconds. In addition, if the above-mentioned film-forming conditions in the initial film-forming step are properly determined according to the purposes for processing, it is possible to provide the formation of films of any of ruthenium and ruthenium oxide.

For example, preferred conditions for the main film-forming (i.e., film-forming conditions for providing a good step coverage) are as follows: the temperature is 290–330° C.; the pressure is 67 Pa–1,333 Pa (i.e., 0.5 Torr–10 Torr); the flow rate of a ruthenium liquid material is 0.01–0.1 ccm; the flow rate of an oxygen-containing gas is 5–200 sccm; and the film-forming time or duration is 60–300 seconds. Moreover, if the above-mentioned film-forming conditions in the main film-forming step are properly determined according to the purposes for processing, it is also possible to provide the formation of films of any of ruthenium and ruthenium oxide.

Figure 7:
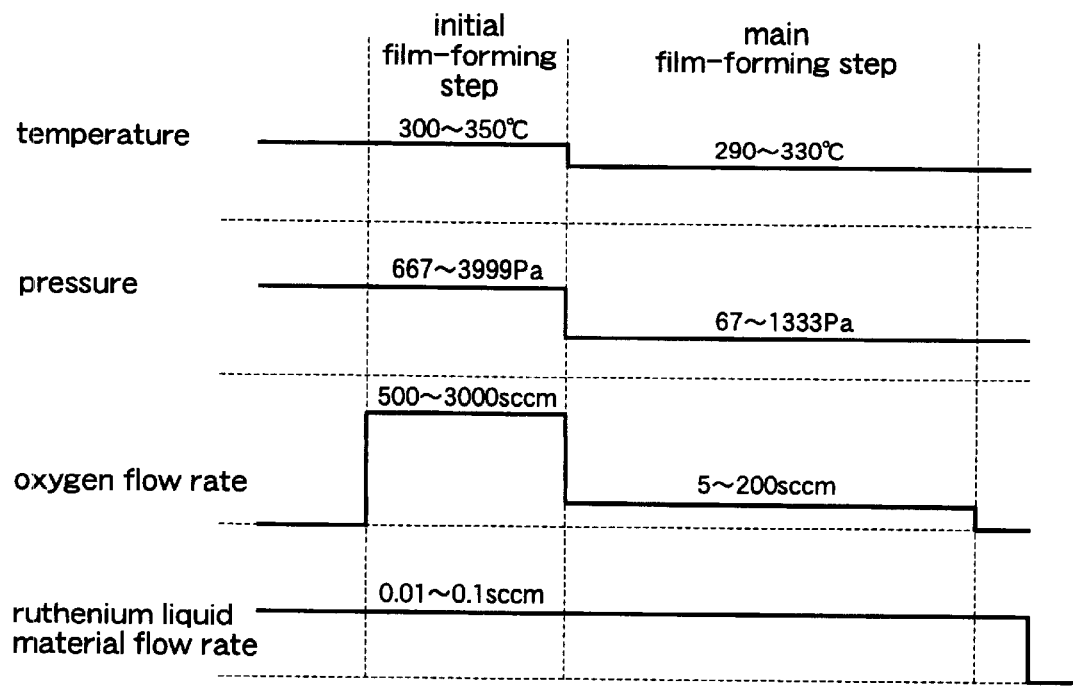
FIG. 7 is a timing chart illustrating process conditions in the initial film-forming step and the main film-forming step.

The timing charts and the process conditions (temperature, pressure, oxygen flow rate, and ruthenium liquid material flow rate) in the initial film-forming step and the main film-forming step as explained above are illustrated in FIG. 7.

Here, from the points of view of preventing a deposition delay in the initial film-forming step and improving the step coverage in the main film-forming step, it is preferred that the above-mentioned film-forming conditions for the initial film-forming step and the main film-forming step be set such that the step coverage is better in the main film-forming step than in the initial film-forming step (i.e., the deposition rate is greater in the initial film-forming step than in the main film-forming step), or the film-forming temperature or pressure is higher in the initial film-forming step than in the main film-forming step, or the ratio of the flow rate of the oxygen-containing gas to the flow rate of the ruthenium liquid material is greater in the initial film-forming step than in the main film-forming step. Moreover, it is preferable to perform the initial film-forming step and the main film-forming step continuously in one and the same reaction chamber from the points of cost, i.e., throughput, the cost of equipment, etc.

Also, it is preferred that the film thickness employed in the initial film-forming step be, for instance, 5–15 nm, and the film thickness in the main film-forming step is, for instance, 10–50 nm.

In addition, the other conditions can properly set as in the conventional well-known thermal CVD method.

The underlayer provided, as required, under the ruthenium film or the ruthenium oxide film in the present invention is not specifically limited but may be, for instance, $SiO_2$, $Si_3N_4$, TiN, $TiO_2$, WN, $Ta_2O_5$, TiAlN, BST, polysilicon, etc.

The ruthenium liquid material used in the present invention can be properly selected from various kinds of materials according to the usage, but one typical example thereof is bisethyl-cyclopentadienyl-ruthenium.

Also, the oxygen-containing gas used in the present invention can be properly selected from various kinds of gases according to the usage, but some typical examples thereof are oxygen ($O_2$) and ozone ($O_3$).

EXAMPLES

Now, reference will be made to preferred examples of the semiconductor manufacturing method and apparatus according to the present invention.

FIGS. 1–4 illustrates the relation between the film-forming conditions in the initial film-forming step and the sheet resistance of the ruthenium films obtained after the main film-forming step. Here, note that the sheet resistance and the film thickness are in the inverse proportion with respect to each other, so it is considered that the smaller the sheet resistance, the greater becomes the film thickness, thus making it difficult to produce a deposition delay.

Figure 1:
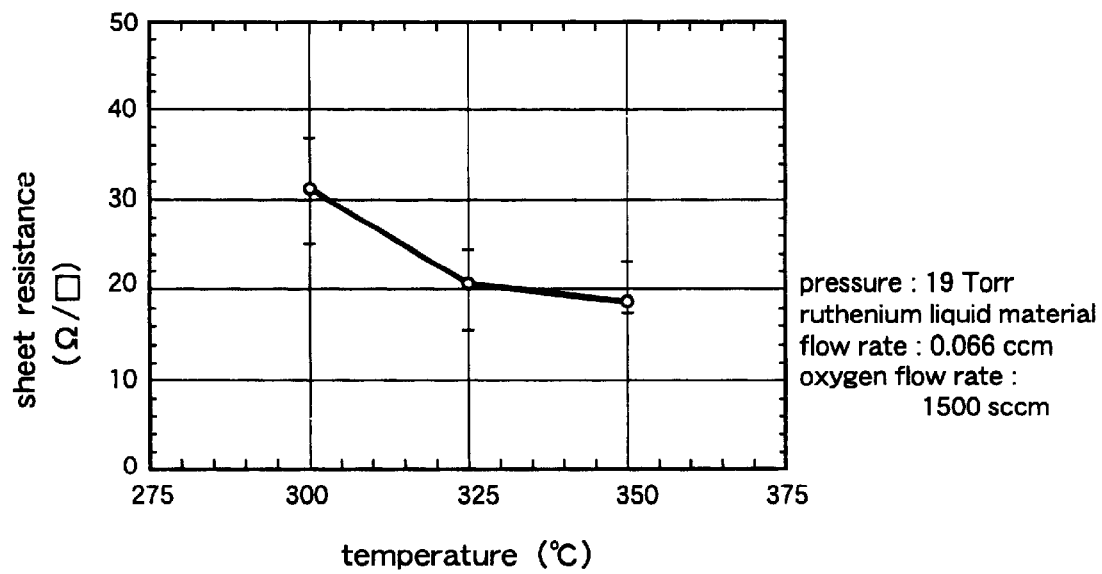
FIG. 1 is a view for explaining the relation between the temperature in an initial film-forming step and the sheet resistance $Rs(\Omega/\square)$ obtained after a main film-forming step.

FIG. 1 illustrates the relation between the temperature in the initial film-forming step and the sheet resistance $Rs(\Omega/\square)$ of the ruthenium films obtained after the main film-forming step. In FIG. 1, the film-forming conditions employed other than the temperature in the initial film-forming step were as follows: the pressure was 2,527 Pa (19 Torr); the flow rate of a ruthenium liquid material (bisethyl-cyclopentadienyl-ruthenium) was 0.066 ccm; the flow rate of an oxygen-containing gas (oxygen) was 1,500 sccm, and the film-forming time or duration was 180 seconds; and an underlayer used for film-forming was an insulation film of $SiO_2$. The film thickness obtained in the initial film-forming step was set to 5–15 nm. The film-forming conditions employed in the main film-forming step were as follows: the temperature was 300° C.; the pressure was 67 Pa (0.5 Torr); the flow rate of the ruthenium liquid material (bisethyl-cyclopentadienyl-ruthenium) was 0.066 ccm; the flow rate of the oxygen-containing gas (oxygen) was 160 sccm; and the film-forming time or duration was 240 seconds. The film thickness obtained in the main film-forming step was set to 20–30 nm (the experiments were carried out in terms of a plurality of film thicknesses).

From FIG. 1, it is found that if the film-forming conditions are set in such a manner that the film-forming temperature is higher in the initial film-forming step than in the main film-forming step, the sheet resistance is reduced, thereby improving the deposition delay.

Figure 2:
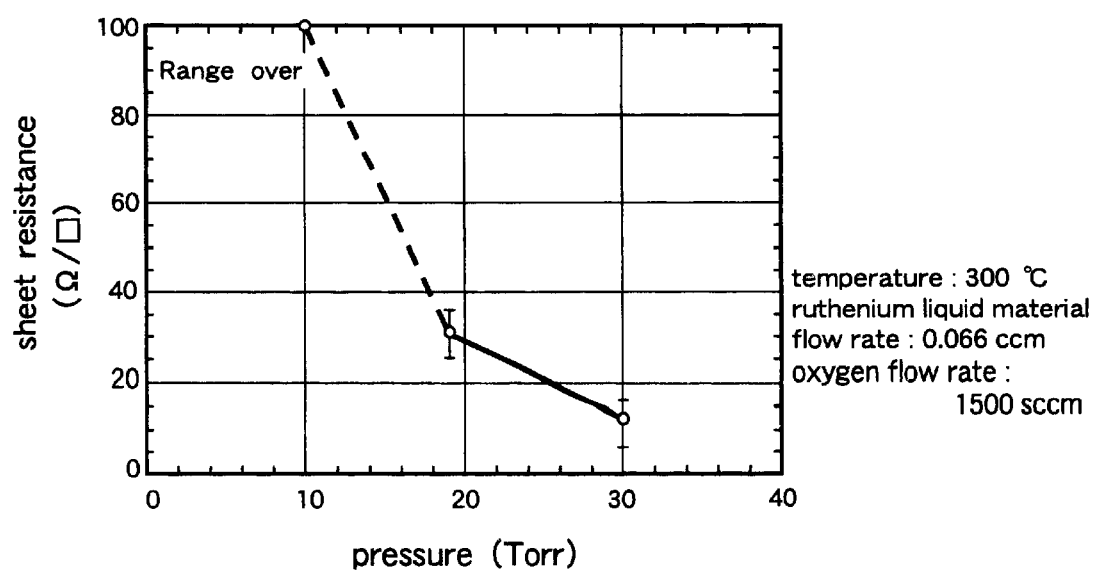
FIG. 2 is a view for explaining the relation between the pressure in the initial film-forming step and the sheet resistance $Rs(\Omega/\square)$ obtained after the main film-forming step.

FIG. 2 illustrates the relation between the pressure employed in the initial film-forming step and the sheet resistance $Rs(\Omega/\square)$ of the ruthenium films obtained after the main film-forming step. In FIG. 2, the film-forming conditions employed in the initial film-forming step other than the pressure were as follows: the temperature was 300° C.; the flow rate of a ruthenium liquid material (bisethyl-cyclopentadienyl-ruthenium) was 0.066 ccm; the flow rate of an oxygen-containing gas (oxygen) was 1,500 sccm; the film-forming time or duration was 180 seconds; and an insulation film of $SiO_2$ was used as an underlayer. The film thickness obtained in the initial film-forming step was set to 5–15 nm. The film-forming conditions in the main film-forming step were as follows: the temperature was 300° C.; the pressure was 67 Pa (0.5 Torr); the flow rate of the ruthenium liquid material (bisethyl-cyclopentadienyl-ruthenium) was 0.066 ccm; the flow rate of the oxygen-containing gas (oxygen) was 160 sccm; and the film-forming time or duration was 240 seconds. The film thickness obtained in the main film-forming step was set to 20–30 nm (the experiments were carried out in terms of a plurality of film thicknesses). In FIG. 2, pressure is over or outside the range at 10 Torr, but this indicates that the sheet resistance is too large to measure at less than 10 Torr. In other words, this means that the deposition delay is remarkable, making it almost impossible to form thin films.

Figure 3:
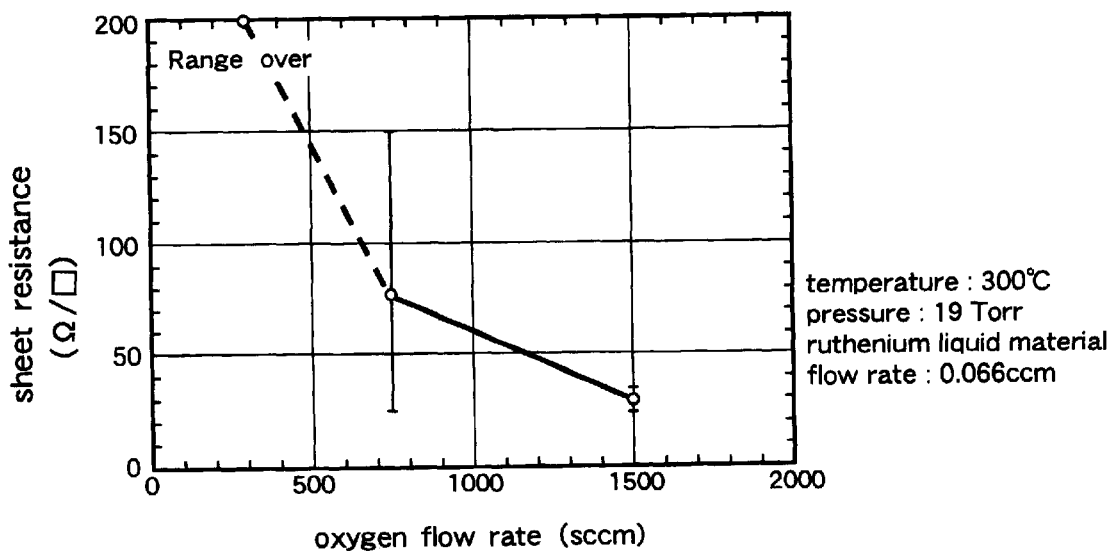
FIG. 3 is a view for explaining the relation between the oxygen flow rate in the initial film-forming step and the sheet resistance $Rs(\Omega/\square)$ obtained after the main film-forming step.

FIG. 3 illustrates the relation between the flow rate of an oxygen-containing gas (oxygen) in the initial film-forming step and the sheet resistance $Rs(\Omega/\square)$ of ruthenium films obtained after the main film-forming step. In FIG. 3, the film-forming conditions other than the oxygen flow rate in the initial film-forming step were as follows: the temperature was 300° C.; the pressure was 2,527 Pa (19 Torr); the flow rate of a ruthenium liquid material (bisethyl-cyclopentadienyl-ruthenium) was 0.066 ccm; the film-forming time or duration was 180 seconds; and an insulation film of $SiO_2$ was used as an underlayer. The film thickness obtained in the initial film-forming step was set to 5–15 nm. The film-forming conditions employed in the main film-forming step were as follows: the temperature was 300° C.; the pressure was 67 Pa (0.5 Torr); the flow rate of the ruthenium liquid material (bisethyl-cyclopentadienyl-ruthenium) was 0.066 ccm; the flow rate of the oxygen-containing gas (oxygen) was 160 sccm; and the film-forming time or duration was 240 seconds. The film thickness obtained in the main film-forming step was set to 20–30 nm (the experiments were carried out in terms of a plurality of film thicknesses). In FIG. 3, the oxygen flow rate is over or outside the range at 300 sccm, but this indicates that the sheet resistance is too large to measure at less than 300 sccm. That is, this means that the deposition delay is remarkable, making it almost impossible to form thin films.

From FIG. 3, it is found that if the film-forming conditions are set such that the flow rate of the oxygen-containing gas (oxygen) is greater in the initial film-forming step than in the main film-forming step, the sheet resistance will be decreased, thereby improving or reducing the deposition delay.

Figure 4:
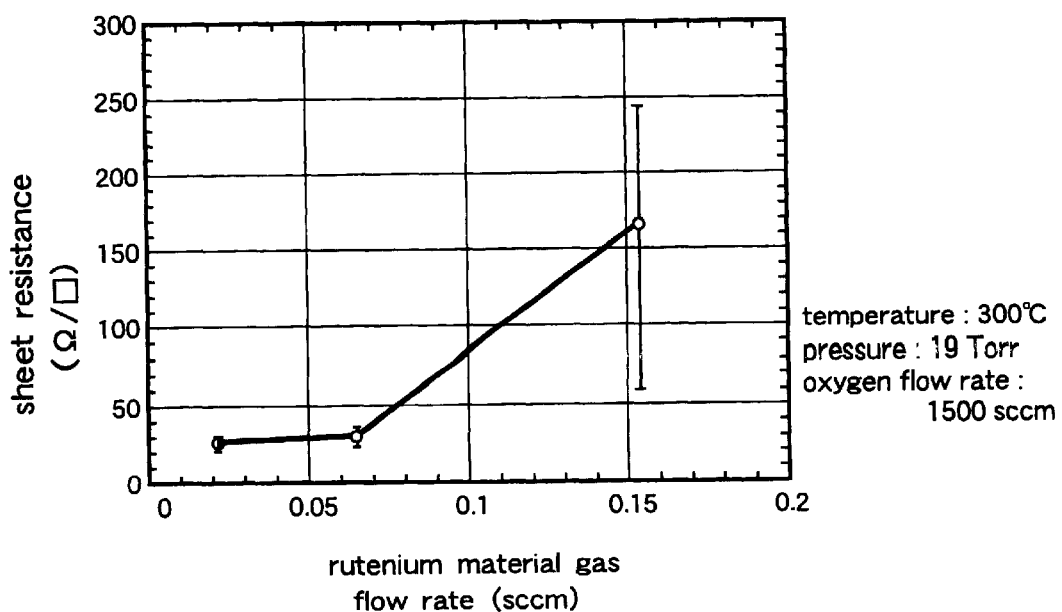
FIG. 4 is a view to explain the relation between the flow rate of a ruthenium liquid material (bisethyl-cyclopentadienyl-ruthenium) in the initial film-forming step and the sheet resistance $Rs(\Omega/\square)$ obtained after the main film-forming step.

FIG. 4 illustrates the relation between the flow rate of a ruthenium liquid material (bisethyl-cyclopentadienyl-ruthenium) in the initial film-forming step and the sheet resistance $Rs(\Omega/\square)$ of ruthenium films obtained after the main film-forming step. In FIG. 4, the film-forming conditions other than the ruthenium liquid material flow rate in the initial film-forming step were as follows: the temperature was 300° C.; the pressure was 2,527 Pa (19 Torr); the flow rate of the oxygen-containing gas (oxygen) was 1,500 sccm; the film-forming time or duration was 180 seconds; and an insulation film of $SiO_2$ was used as an underlayer for film-forming. The film thickness obtained in the initial film-forming step was set to 5–15 nm. The film-forming conditions employed in the main film-forming step were as follows: the temperature was 300° C.; the pressure was 67 Pa (0.5 Torr); the flow rate of the ruthenium liquid material (bisethyl-cyclopentadienyl-ruthenium) was 0.066 ccm; the flow rate of the oxygen-containing gas (oxygen) was 160 sccm; and the film-forming time or duration was 240 seconds. The film thickness obtained in the main film-forming step was set to 20–30 nm (the experiments were carried out in terms of a plurality of film thicknesses).

From FIG. 4, it is found that if the film-forming conditions are set such that the flow rate of the ruthenium liquid material in the initial film-forming step is equal to or less than that in the main film-forming step, the sheet resistance will be decreased, thus improving the deposition delay.

Also, from FIG. 3 and FIG. 4, it is found that if the film-forming conditions are set such that the ratio of the oxygen-containing gas (oxygen) flow rate to the ruthenium liquid material flow rate is greater in the initial film-forming step than in the main film-forming step, the sheet resistance will be decreased, thus reducing the deposition delay accordingly.

In any of the FIG. 1 through FIG. 4 examples, the step coverage of the ruthenium films formed in the film-forming process is 90% or more in terms of an aspect ratio 4, and the surface morphology thereof thus obtained is excellent.

Figure 5:
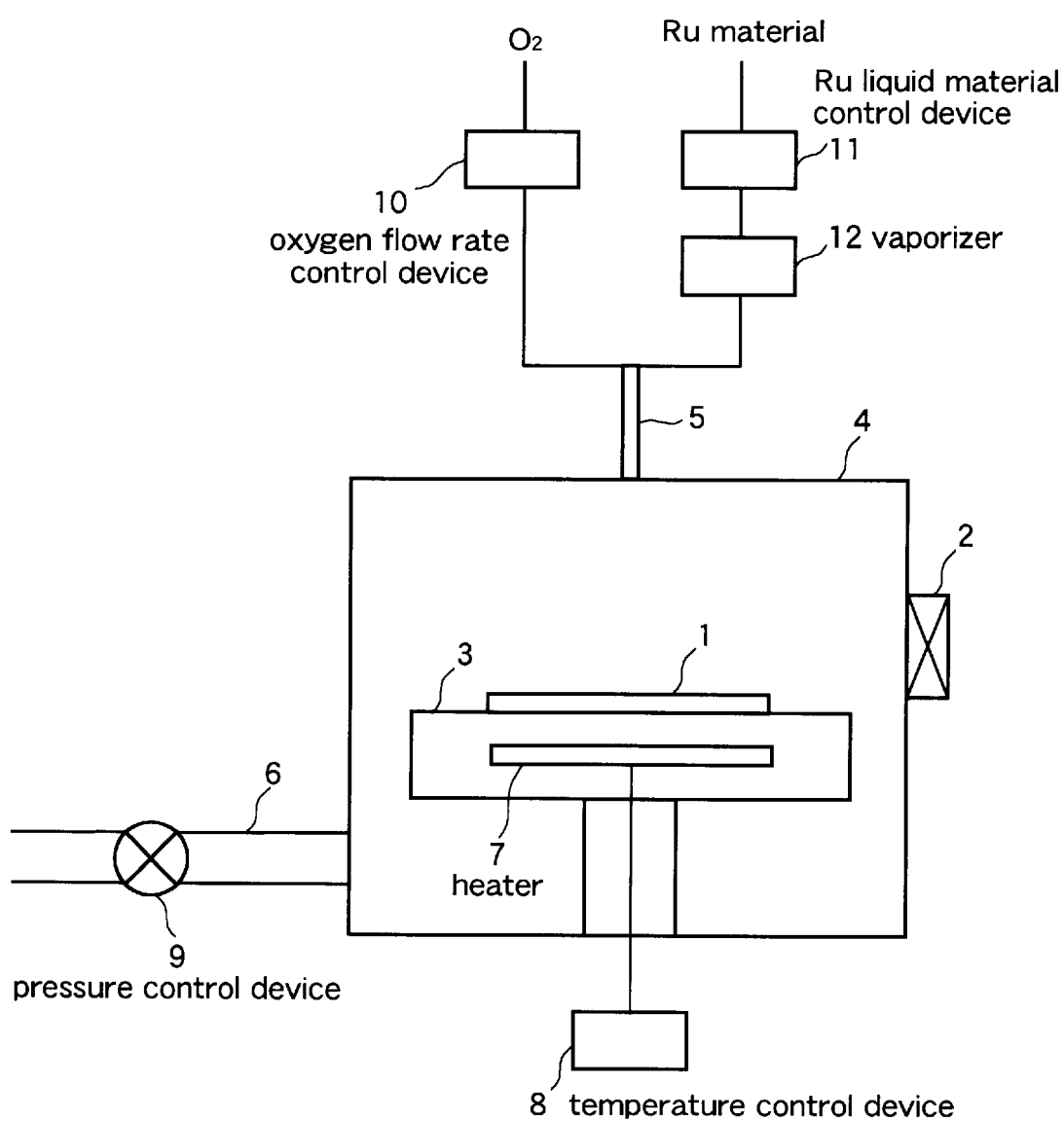
FIG. 5 is a view for explaining one example of a thermal CVD apparatus which can be used in the present invention.

FIG. 5 illustrates an example of a thermal CVD apparatus adapted to be used in the present invention. In FIG. 5, a substrate 1 is conveyed through a gate valve 2 to a substrate holder 3 with a heater 7 in a reaction chamber 4 and set up thereon by means of a delivery device (not shown) such as a delivery robot or the like. The heater 7 is caused to move in an upward direction to a prescribed position by means of a lifter or vertically driving mechanism (not shown) so that it is controlled to heat the substrate 1 for a predetermined period of time under the control of a temperature control device 8. After the pressure in a reaction chamber 4 has been controlled to be stabilized at a desired value by means of a pressure control device 9 connected to the reaction chamber 9, gases of raw materials for forming ruthenium films or ruthenium oxide films on the substrate 1 are introduced into the reaction chamber 4 through a gas feed port 5 and exhausted to the outside through a gas exhaust port 6, while performing an initial film-forming step and a main film-forming step by means of a thermal CVD method. Here, note that the temperatures, pressures, the flow rates of an oxygen-containing gas in the form of an oxygen gas, and the flow rates of a ruthenium liquid material in the respective process steps are controlled to fulfill the above-mentioned desired film-forming conditions by means of a temperature control device 8, the pressure control device 9, an oxygen flow rate control device 10, and a ruthenium liquid material flow rate control device 11. When the main film-forming step has been completed, the substrate 1 is carried out from the reaction chamber 4 by means of the delivery device.

Figure 6:
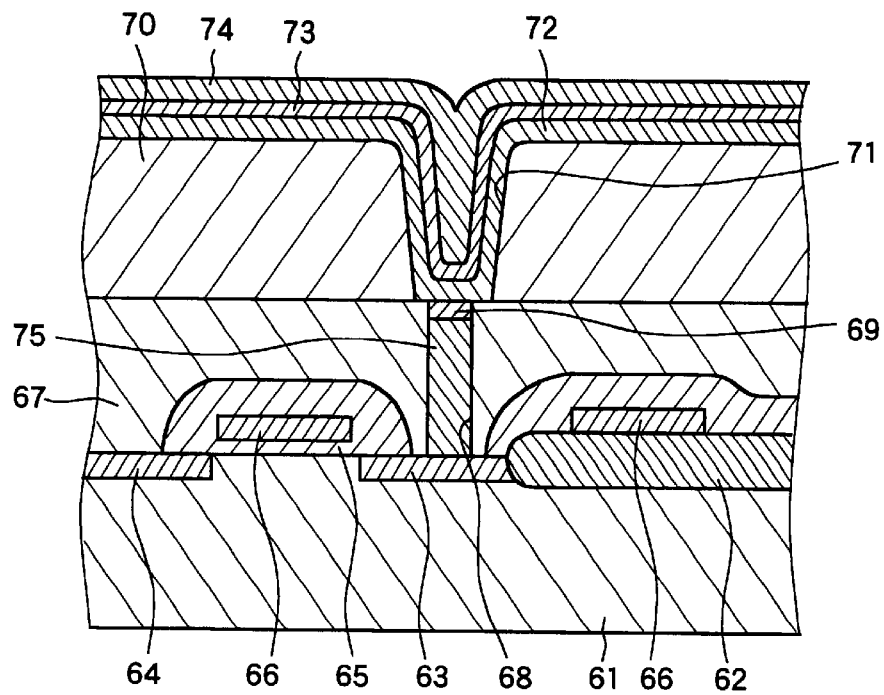
FIG. 6 is a cross sectional view illustrating a part of a DRAM including ruthenium films or ruthenium oxide films formed by using a manufacturing method of the present invention.

FIG. 6 illustrates, in cross section, a part of a DRAM including a ruthenium film or a ruthenium oxide film formed by using the semiconductor manufacturing method of the present invention.

As shown in FIG. 6, on a surface of a silicon substrate 61, there are formed field oxide films 62 for forming a multitude of transistor-forming regions in a mutually separated manner. Also, on the surface of the silicon substrate 61, there are formed source electrodes 63 and drain electrodes 64 with gate electrodes 66 acting as word lines being disposed therebetween via gate insulation films 65, respectively, on which a first interlayer insulation film 67 is provided. Contact holes 68 are formed through the first interlayer insulation film 67, and a barrier metal 69 and a plug electrode 75 connected to a corresponding one of the source electrodes 63 are formed in each of the contact holes 68. On the first interlayer insulation film 67, there is formed a second interlayer insulation film 70 through which contact holes 71 are formed. On the second interlayer insulation film 70 and in the contact holes 71, there is provided a capacitance lower electrode 72 which is made of ruthenium and connected with the barrier metals 69. Formed on the capacitance lower electrode 72A is a capacitance insulation film 73 made of $Ta_2O_5$ on which is formed a capacitance upper electrode 74 made of ruthenium, titanium nitride, or the like. That is, with this DRAM, a capacitor cell is connected with the source electrode 63 of a MOS transistor.

Next, reference will be had to a method of manufacturing the DRAM illustrated in FIG. 6. First, a field oxide film 62 is formed in the surroundings of each transistor-forming region on the surface of the silicon substrate 61 by means of a LOCOS process. Subsequently, a gate electrode 66 is formed in each transistor-forming region through a corresponding gate insulation layer 65. Thereafter, impurities are introduced into the surface of the silicon substrate 61 by ion-implantation using the field oxide films 62 and the gate electrodes 66 as masks, thus forming the source electrodes 63 and the drain electrodes 64 in a self-aligned manner. After each gate electrode 66 is covered with an insulating film, the first interlayer insulation film 67 is formed on the substrate 61. Then, each contact hole 68 through which a corresponding source electrode 63 is exposed is formed through the first interlayer insulation film 67, and the plug electrode 75 and the barrier metal 79 are formed in each contact hole 68. Subsequently, the second interlayer insulation film 70 is formed on the first interlayer insulation film 67, and the contact holes 71 are formed through the interlayer insulation film 70 so as to expose the corresponding barrier metals 69, respectively. Thereafter, a ruthenium film or a ruthenium oxide film is deposited on the interlayer insulation film 70 and in the contact holes 71 by means of the semiconductor manufacturing method of the present invention, and patterning is effected to provide the capacitance lower electrode 72. The capacitance insulation film 73 made of $Ta_2O_5$ is then formed on the capacitance lower electrode 72, and the capacitance upper electrode 74 made of ruthenium, titanium nitride, etc., is in turn formed on the capacitance insulation film 73.

As described above, according to the present invention, there is provided a semiconductor manufacturing method and a semiconductor manufacturing apparatus which are excellent in the step coverage, and capable of manufacturing semiconductor devices at low cost and with high productivity.

What is claimed is:

1. A semiconductor manufacturing method including a film-forming process in which ruthenium films or ruthenium oxide films are formed on a substrate according to a thermal chemical vapor deposition (CVD) method by using a gas vaporized from a ruthenium liquid material and an oxygen-containing gas, said film-forming process comprising:

an initial film-forming step for initially forming a first thin film of ruthenium or ruthenium oxide on said substrate under first film-forming conditions; and a main film-forming step for forming a second thin film of ruthenium or ruthenium oxide on said first thin film under second film-forming conditions different from said first film-forming conditions, said second thin film having a thickness greater than that of said first thin film.

2. The semiconductor manufacturing method as claimed in claim 1, wherein said initial film-forming step and said main film-forming step are performed continuously in one and the same reaction chamber by means of a thermal CVD method.

3. The semiconductor manufacturing method as claimed in claim 1, wherein said second film-forming conditions in said main film-forming step provide a step coverage better than that of said first film-forming conditions in said initial film-forming step.

4. The semiconductor manufacturing method as claimed in claim 1, wherein said first film-forming conditions in said initial film-forming step provides a deposition rate greater than that of said second film-forming conditions in said main film-forming step.

5. The semiconductor manufacturing method as claimed in claim 1, wherein said first film-forming conditions in said initial film-forming step provide a film-forming temperature or pressure higher than that of said second film-forming conditions in said main film-forming step.

6. The semiconductor manufacturing method as claimed in claim 1, wherein said first film-forming conditions in said initial film-forming step provide a ratio of a flow rate of said oxygen-containing gas to a flow rate of said vaporized ruthenium gas greater than that of said second film-forming conditions in said main film-forming step.

7. The semiconductor manufacturing method as claimed in claim 1, wherein said first film-forming conditions in said initial film-forming step comprises a film-forming temperature in the range of from 300° C. to 350° C. and a film-forming pressure in the range of from 667 Pa to 3,999 Pa.

8. The semiconductor manufacturing method as claimed in claim 1, wherein said ruthenium liquid material comprises bisethyl-cyclopentadienyl-ruthenium.

9. A semiconductor manufacturing method including a film-forming process in which ruthenium films or ruthenium oxide films are formed according to a thermal CVD method on a substrate by using a gas vaporized from a ruthenium liquid material and an oxygen-containing gas, said film-forming process comprising:

initially forming a first thin film of ruthenium or ruthenium oxide on said substrate under first film-forming conditions; and forming a second thin film of ruthenium or ruthenium oxide on said first thin film under second film-forming conditions, different from said first film-forming conditions, said second thin film having a thickness greater than that of said first thin film, wherein said initially forming a first thin film and said forming a second thin film are performed continuously in one and the same reaction chamber.

10. The semiconductor manufacturing method as claimed in claim 9, wherein said initially forming a first thin film and forming a second thin film are performed continuously by a thermal CVD method.

11. The semiconductor manufacturing method as claimed in claim 9, wherein said second film-forming conditions in said forming a second thin film provide a step coverage better than that of said first film-forming conditions in said initially forming a first thin film.

12. The semiconductor manufacturing method as claimed in claim 9, wherein said first film-forming conditions in said initially forming a first thin film provides a deposition rate greater than that of said second film-forming conditions in said forming a second thin film.

13. The semiconductor manufacturing method as claimed in claim 9, wherein said first film-forming conditions in said initially forming a first thin film provide at least one of a film-forming temperature and a pressure higher than that of said second film-forming conditions in said forming a second thin film.

14. The semiconductor manufacturing method as claimed in claim 9, wherein said first film-forming conditions in said initially forming a first thin film provide a ratio of a flow rate of said oxygen-containing gas to a flow rate of said vaporized ruthenium gas greater than that of said second film-forming conditions in said forming a second thin film.

15. The semiconductor manufacturing method as claimed in claim 9, wherein said first film-forming conditions in said initially forming a first thin film comprises a film-forming temperature in the range of from 300° C. to 350° C.

16. The semiconductor manufacturing method as claimed in claim 9, wherein said first film-forming conditions in said initially forming a first thin film comprises a film-forming pressure in the range of from 667 Pa to 3,999 Pa.

17. The semiconductor manufacturing method as claimed in claim 9, wherein said ruthenium liquid material comprises bisethyl-cyclopentadienyl-ruthenium.

18. A semiconductor manufacturing method including a film-forming process in which ruthenium films or ruthenium oxide films are formed on a substrate according to a thermal CVD method by using a gas vaporized from a ruthenium liquid material and an oxygen-containing gas, said film-forming process comprising:

initially forming a first thin film of ruthenium or ruthenium oxide on said substrate under first film-forming conditions; and forming a second thin film of ruthenium or ruthenium oxide on said first thin film under second film-forming conditions, different from said first film-forming conditions, said second thin film having a thickness greater than that of said first thin film, wherein said initially forming a first thin film and said forming a second thin film are performed continuously, without any intervening interruption.

19. The semiconductor manufacturing method as claimed in claim 18, wherein said initially forming a first thin film and said forming a second thin film are performed continuously in a single reaction chamber.

20. The semiconductor manufacturing method as claimed in claim 18, wherein said second film-forming conditions in said forming a second thin film provide a step coverage better than that of said first film-forming conditions in said initially forming a first thin film.

* * * * *